United States Patent
Sonehara et al.

(10) Patent No.: US 9,893,079 B2
(45) Date of Patent: Feb. 13, 2018

(54) SEMICONDUCTOR MEMORY DEVICE

(71) Applicant: Toshiba Memory Corporation, Minato-ku (JP)

(72) Inventors: Takeshi Sonehara, Yokkaichi (JP); Masaru Kito, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/834,636

(22) Filed: Aug. 25, 2015

(65) Prior Publication Data

US 2016/0284727 A1 Sep. 29, 2016

Related U.S. Application Data

(60) Provisional application No. 62/139,298, filed on Mar. 27, 2015.

(51) Int. Cl.
*H01L 29/66* (2006.01)
*H01L 27/11582* (2017.01)
*H01L 23/528* (2006.01)
*H01L 23/535* (2006.01)
(Continued)

(52) U.S. Cl.
CPC ...... *H01L 27/11582* (2013.01); *H01L 23/528* (2013.01); *H01L 23/535* (2013.01); *H01L 27/1157* (2013.01); *H01L 27/11575* (2013.01)

(58) Field of Classification Search
CPC ......... H01L 27/11565; H01L 27/11575; H01L 29/7926; H01L 27/11582; H01L 27/11526; H01L 27/11551; H01L 27/11556; H01L 29/7881; H01L 29/66666; H01L 21/823481; H01L 29/04; H01L 29/16; G11C 16/04; G11C 16/0408; G11C 16/14
See application file for complete search history.

(56) References Cited

U.S. PATENT DOCUMENTS

| 7,821,058 B2 | 10/2010 | Kidoh et al. |
| 7,972,955 B2 | 7/2011 | Choi et al. |
| 8,089,120 B2 | 1/2012 | Tanaka et al. |

(Continued)

FOREIGN PATENT DOCUMENTS

| JP | 2008-171918 | 7/2008 |
| JP | 2010-114113 | 5/2010 |
| JP | 2011-54899 | 3/2011 |

*Primary Examiner* — Charles Garber
*Assistant Examiner* — Abdulfattah Mustapha
(74) *Attorney, Agent, or Firm* — Oblon, McClelland, Maier & Neustadt, L.L.P.

(57) ABSTRACT

According to an embodiment, a semiconductor memory device comprises a plurality of control gate electrodes, a semiconductor layer, and a charge accumulation layer. The plurality of control gate electrodes are stacked on a substrate. The semiconductor layer has one end connected to the substrate, has as its longer direction a direction perpendicular to the substrate, and faces the plurality of control gate electrodes. The charge accumulation layer is positioned between the control gate electrode and the semiconductor layer. Assuming at least one control gate electrode positioned in a lowermost layer of the plurality of control gate electrodes to be a first control gate electrode, the first control gate electrode comprises: a first portion; a second portion adjacent to the first portion; and a third portion connected to the first portion and the second portion.

18 Claims, 14 Drawing Sheets

(51) Int. Cl.
*H01L 27/1157* (2017.01)
*H01L 27/11575* (2017.01)

(56) References Cited

U.S. PATENT DOCUMENTS

| | | | |
|---|---|---|---|
| 8,169,016 B2 | 5/2012 | Higashi | |
| 8,456,909 B2 | 6/2013 | Lee et al. | |
| 2009/0310425 A1* | 12/2009 | Sim | H01L 27/11526 |
| | | | 365/185.29 |
| 2010/0181612 A1* | 7/2010 | Kito | H01L 27/11551 |
| | | | 257/319 |
| 2011/0057250 A1* | 3/2011 | Higashi | H01L 27/11578 |
| | | | 257/324 |
| 2013/0009274 A1 | 1/2013 | Lee et al. | |

* cited by examiner

SEMICONDUCTOR MEMORY DEVICE

CROSS-REFERENCE TO RELATED APPLICATIONS

This application is based upon and claims the benefit of U.S. Provisional Patent Application No. 62/139,298, filed on Mar. 27, 2015, the entire contents of which are incorporated herein by reference.

FIELD

Embodiments described herein relate to a semiconductor memory device.

BACKGROUND

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

A semiconductor memory device according to an embodiment comprises a plurality of control gate electrodes, a semiconductor layer, and a charge accumulation layer. The plurality of control gate electrodes are stacked on a substrate. The semiconductor layer has one end connected to the substrate, has as its longer direction a direction perpendicular to the substrate, and faces the plurality of control gate electrodes. The charge accumulation layer is positioned between the control gate electrode and the semiconductor layer. Assuming at least one control gate electrode positioned in a lowermost layer of the plurality of control gate electrodes to be a first control gate electrode, the first control gate electrode comprises a first portion, a second portion, and a third portion. The second portion is provided adjacent to the first portion. The first portion and the second portion are extending in a first direction. The third portion is connected to an end of the first portion and an end of the second portion. The third portion is extending in a second direction crossing to the first direction.

Next, nonvolatile semiconductor memory devices according to embodiments will be described in detail with reference to the drawings. Note that these embodiments are merely examples. For example, the nonvolatile semiconductor memory devices described below have a structure in which a memory string extends linearly in a perpendicular direction to a substrate, but a similar structure may be applied also to a U-shaped structure in which the memory string is doubled back on an opposite side midway. In addition, each of the drawings of the nonvolatile semiconductor memory devices employed in the embodiments below is schematic, and thicknesses, widths, ratios, and so on, of layers are not necessarily identical to those of the actual nonvolatile semiconductor memory devices.

Moreover, the embodiments below relate to nonvolatile semiconductor memory devices having a structure in which a plurality of MONOS (Metal-Oxide-Nitride-Oxide-Semiconductor) type memory cells (transistors) are provided in a height direction, each of the MONOS type memory cells including: a semiconductor film acting as a channel provided in a column shape perpendicularly to a substrate; and a gate electrode film provided on a side surface of the semiconductor film via a charge accumulation layer. However, a similar structure may be applied also to a memory cell of another form, for example, a SONGS (Semiconductor-Oxide-Nitride-Oxide-Semiconductor) type memory cell or a MANOS (Metal-Aluminum Oxide-Nitride-Oxide-Semiconductor) type memory cell, one employing hafnium oxide (HfO$_x$) or tantalum oxide (TaO$_x$) as an insulating layer, or a floating gate type memory cell.

First Embodiment

Figure 1:
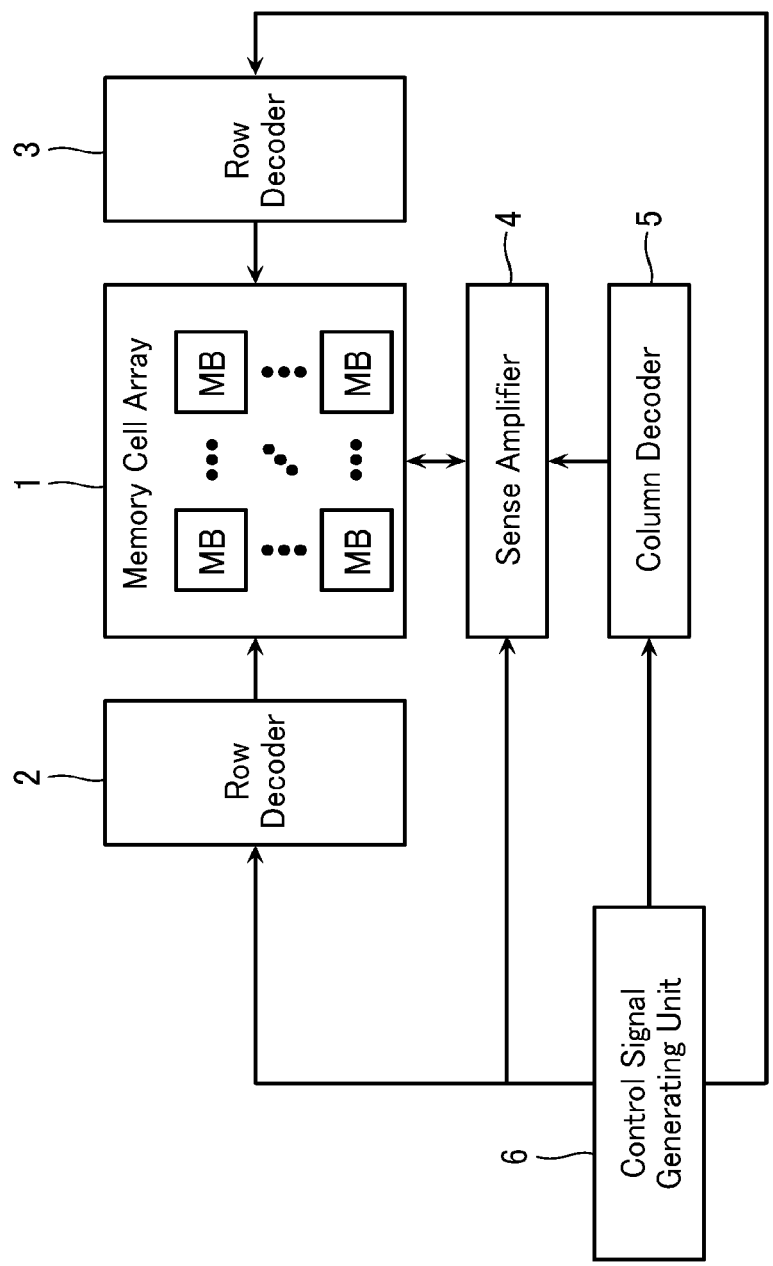
FIG. 1 is a functional block diagram showing a configuration of a semiconductor memory device according to a first embodiment.

FIG. 1 is a functional block diagram showing a configuration of a semiconductor memory device according to a first embodiment. The semiconductor memory device according to the embodiment comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory cells MC arranged three-dimensionally therein. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a high voltage employed during the write operation or an erase operation, generates a control signal and controls the row decoders 2 and 3, the sense amplifier 4, and the column decoder 5.

Figure 2:
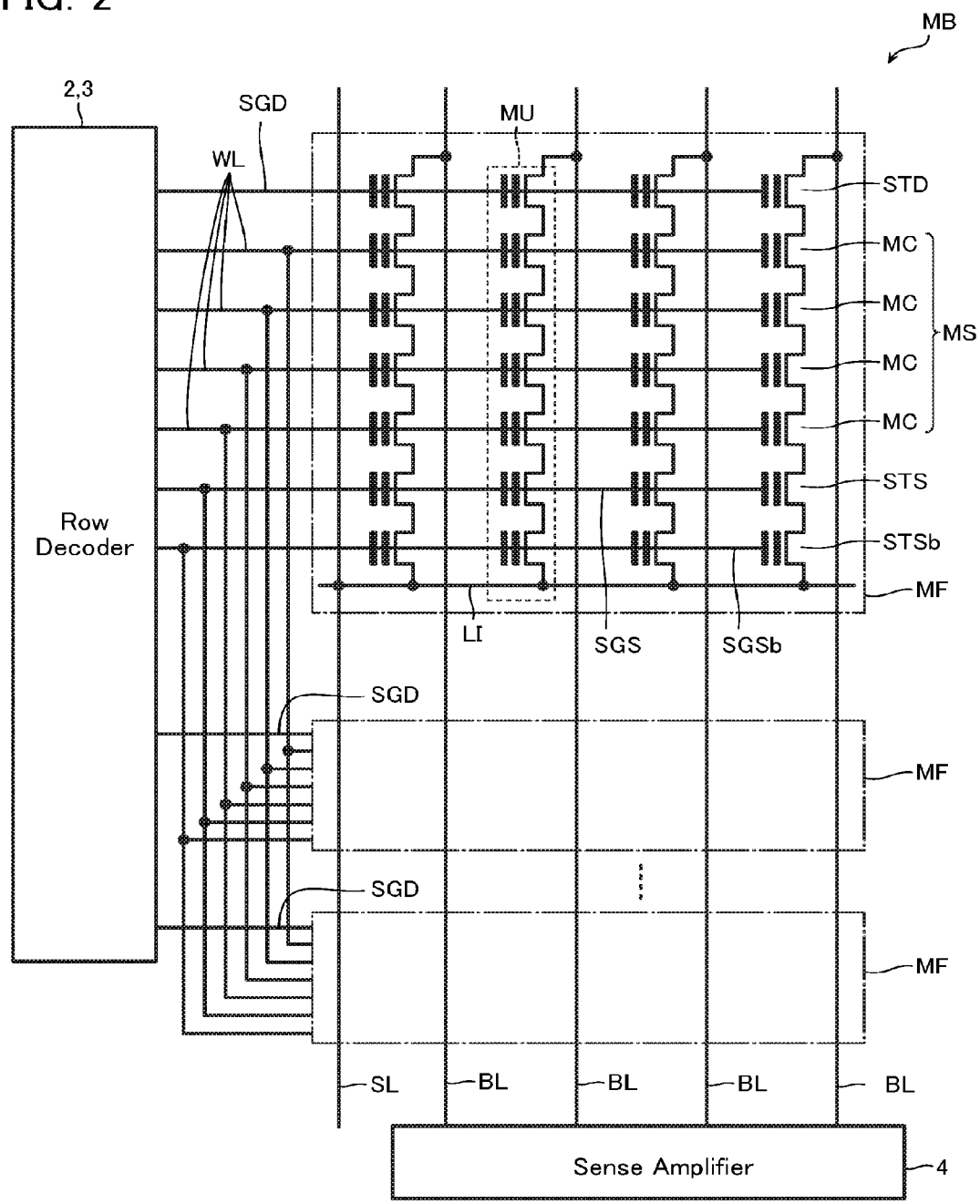
FIG. 2 is an equivalent circuit diagram showing a configuration of a memory cell array 1 of the same semiconductor memory device.

Next, a circuit configuration of part of the memory cell array 1 according to the present embodiment will be described with reference to FIG. 2. FIG. 2 is an equivalent circuit diagram showing a configuration of the memory block MB. In the memory block MB shown in FIG. 2, a certain drain side select gate line SGD and a certain word line WL are selected by the row decoders 2 and 3, and data of a certain number of memory cells MC is read via a certain number of bit lines BL.

As shown in FIG. 2, the memory blocks MB each comprise a plurality of memory fingers MF. Commonly connected to these plurality of memory fingers MF are a plurality of the bit lines BL and a source line SL. Each of the memory fingers MF is connected to the sense amplifier 4 via the bit line BL, and is connected to an unillustrated source line driver via the source line SL.

The memory finger MF comprises a plurality of memory units MU that have their one ends connected to the bit line BL and have their other ends connected to the source line SL via a source contact LI. The memory units MU included in one memory finger MF are all connected to different bit lines BL.

As shown in FIG. 2, the memory unit MU comprises a plurality of the memory cells MC connected in series. As will be described later, the memory cell MC comprises a semiconductor layer, a charge accumulation layer, and a control gate, and accumulates a charge in the charge accumulation layer based on a voltage applied to the control gate, thereby changing a threshold value of the memory cell MC. Note that hereafter, the plurality of the memory cells MC connected in series will be called a "memory string MS". The row decoders 2 and 3 transfer a voltage to a certain word line WL, thereby transferring this voltage to the control gate of a certain memory cell MC in the memory string MS.

As shown in FIG. 2, commonly connected to the control gates of pluralities of the memory cells MC configuring different memory strings MS are, respectively, the word lines WL. These pluralities of memory cells MC are connected to the row decoder 2 or the row decoder 3 via the word lines WL. Moreover, in the example shown in FIG. 2, the word lines WL are provided independently to each of the memory cells MC included in the memory unit MU, and are provided commonly for all of the memory units MU included in one memory block MB.

As shown in FIG. 2, the memory unit MU comprises a drain side select gate transistor STD connected between the memory string MS and the bit line BL. Connected to a control gate of the drain side select gate transistor STD is the drain side select gate line SGD. The drain side select gate line SGD is connected to the row decoder 2 or the row decoder 3, and selectively connects the memory string MS and the bit line BL based on an inputted signal. Moreover, in the example shown in FIG. 2, the drain side select gate lines SGD are provided independently to each of the memory fingers MF, and are commonly connected to the control gates of all of the drain side select gate transistors STD in the memory finger MF. The row decoders 2 and 3 select a certain drain side select gate line SGD, thereby selectively connecting all of the memory strings MS in a certain memory finger MF to the bit line BL.

Moreover, as shown in FIG. 2, the memory unit MU comprises a source side select gate transistor STS and a lowermost layer source side select gate transistor STSb that are connected between the memory string MS and the source contact LI. Connected to a control gate of the source side select gate transistor STS is a source side select gate line SGS. In addition, connected to a control gate of the lowermost layer source side select gate transistor STSb is a lowermost layer source side select gate line SGSb. Moreover, in the example shown in FIG. 2, the source side select gate line SGS is commonly connected to all of the source side select gate transistors STS in the memory block MB. Similarly, the lowermost layer source side select gate line SGSb is commonly connected to all of the lowermost layer source side select gate transistors STSb in the memory block MB. The row decoders 2 and 3 connect all of the memory strings MS in the memory block MB to the source line SL, based on an inputted signal.

Figure 3:
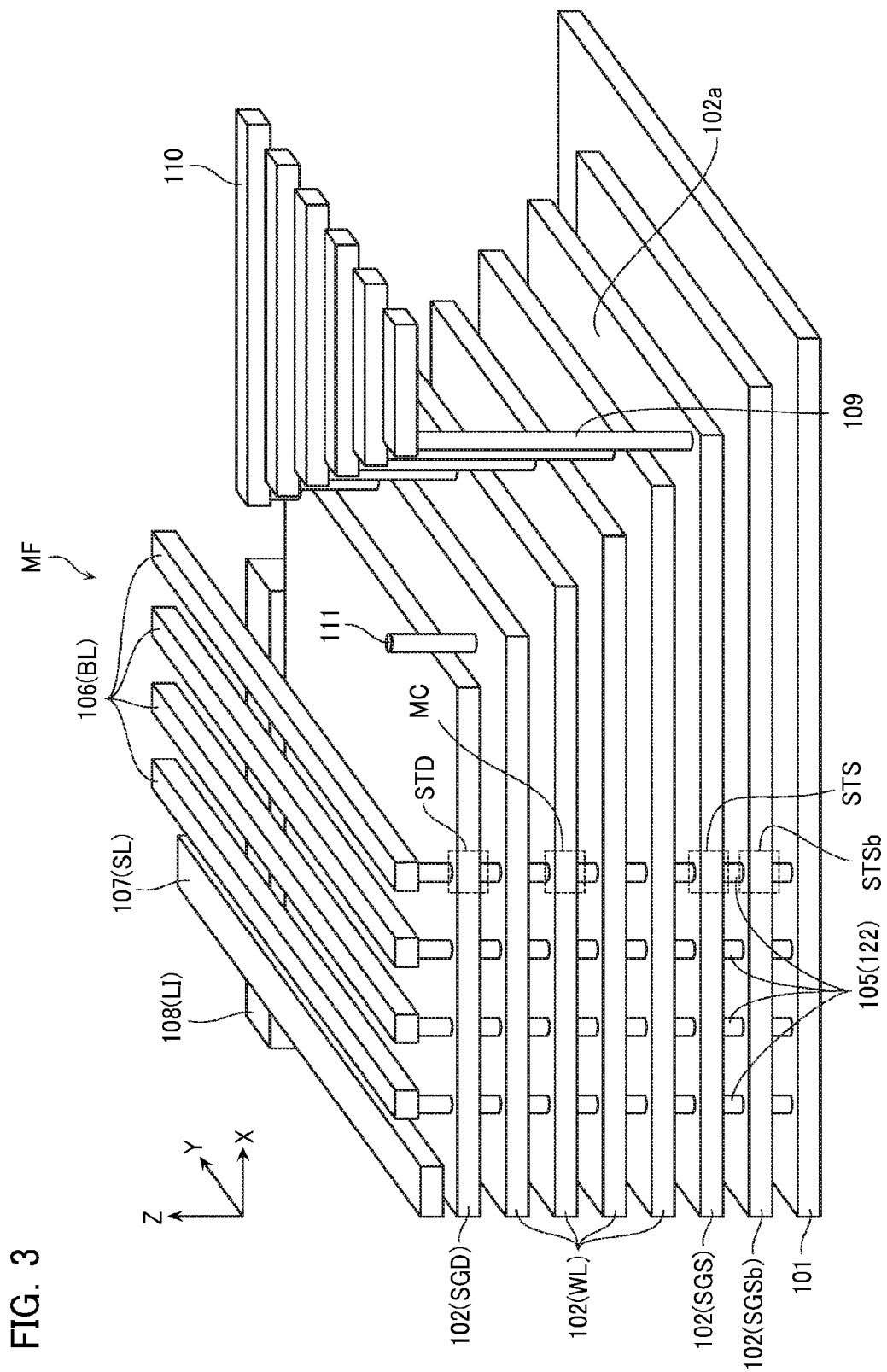
FIG. 3 is a perspective view showing the configuration of the memory cell array 1 of the same semiconductor memory device.

Next, a schematic configuration of the memory cell array 1 will be described with reference to FIG. 3. FIG. 3 is a schematic perspective view showing a configuration of part of the memory finger MF (memory cell group). Note that in FIG. 3, part of the configuration is omitted.

As shown in FIG. 3, the memory finger MF comprises: a substrate 101; and a plurality of conductive layers 102 stacked in a Z direction on the substrate 101. In addition, the memory finger MF includes a plurality of memory columnar bodies 105 extending in the Z direction. As shown in FIG. 3, an intersection of the conductive layer 102 and the memory columnar body 105 functions as the lowermost layer source side select gate transistor STSb, the source side select gate transistor STS, the memory cell MC, or the drain side select gate transistor STD. The conductive layer 102 is configured from a conductive layer of the likes of tungsten (W) or polysilicon, for example, and functions as the word line WL, the source side select gate line SGS, the drain side select gate line SGD, and the lowermost layer source side select gate line SGSb.

As shown in FIG. 3, the plurality of conductive layers 102 are formed in steps, at an end in an X direction. That is, the conductive layer 102 comprises a contact portion 102a that does not face a lower surface of the conductive layer 102 positioned in a layer above it. Moreover, the conductive layer 102 is connected to a via contact wiring line 109 at this contact portion 102a. Moreover, a wiring line 110 is provided at an upper end of the via contact wiring line 109. Note that the via contact wiring line 109 and the wiring line 110 are configured from a conductive layer of the likes of tungsten.

In addition, as shown in FIG. 3, the memory finger MF comprises a support 111. The support 111 communicates with holes provided in the plurality of conductive layers 102. The support 111 supports a posture of an unillustrated insulating layer provided between the conductive layers 102, in a manufacturing step.

Moreover, as shown in FIG. 3, the memory finger MF comprises a conductive layer 108. The conductive layer 108 faces side surfaces in a Y direction of the plurality of conductive layers 102, and extends in the X direction. A lower surface of the conductive layer 108 contacts the substrate 101. The conductive layer 108 is configured from a conductive layer of the likes of tungsten (W), for example, and functions as the source contact LI.

Note that a material of the conductive layer 102 is conceivably configured from a conductive layer of the likes of WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MnSi_x$, and $FeSi_x$, for example, besides the above-described tungsten (W).

Moreover, as shown in FIG. 3, the memory finger MF comprises a plurality of conductive layers 106 and a conductive layer 107 that are positioned above the plurality of conductive layers 102 and the memory columnar body 105, are arranged in plurality in the X direction, and extend in the Y direction. The memory columnar bodies 105 are respectively connected to lower surfaces of the conductive layers 106. The conductive layer 106 is configured from a conductive layer of the likes of tungsten (W), for example, and functions as the bit line BL. Moreover, the conductive layer 108 is connected to a lower surface of the conductive layer 107. The conductive layer 107 is configured from a conductive layer of the likes of tungsten (W), for example, and functions as the source line SL.

Figure 4:
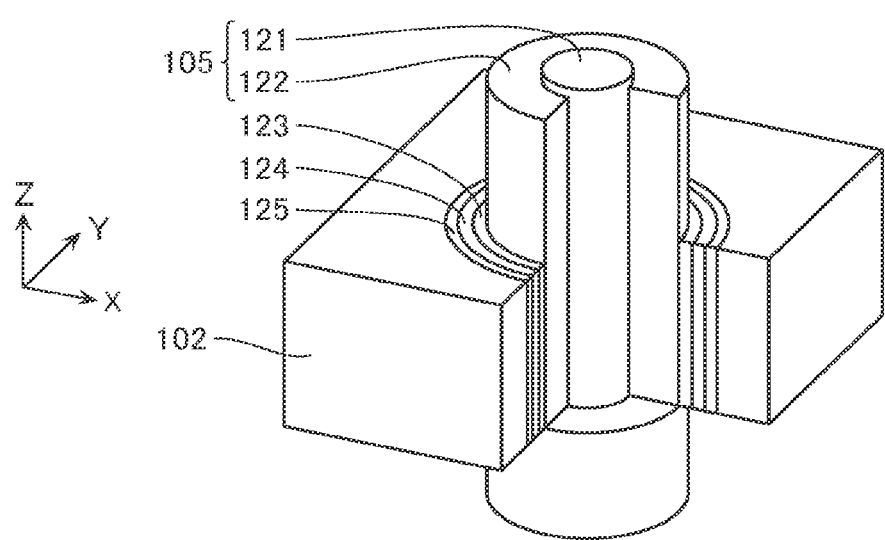
FIG. 4 is a perspective view showing a configuration of a memory cell MC of the same semiconductor memory device.

Next, a schematic configuration of the memory cell MC will be described with reference to FIG. 4. FIG. 4 is a schematic perspective view showing the configuration of the memory cell MC. Note that FIG. 4 shows the configuration of the memory cell MC, but the lowermost layer source side select gate transistor STSb, the source side select gate transistor STS, and the drain side select gate transistor STD may also be configured similarly to the memory cell MC. Note that in FIG. 4, part of the configuration is omitted.

As shown in FIG. 4, the memory cell MC is provided at an intersection of the conductive layer 102 and the memory columnar body 105. The memory columnar body 105 comprises: a core insulating layer 121; and a semiconductor layer 122 that covers a sidewall of the core insulating layer 121. Furthermore, provided between the semiconductor layer 122 and the conductive layer 102 are a tunnel insulating layer 123, a charge accumulation layer 124, and a block insulating layer 125.

The core insulating layer 121 is configured from an insulating layer of the likes of silicon oxide ($SiO_2$), for example. The semiconductor layer 122 is configured from a semiconductor layer of the likes of polysilicon, for example, and functions as a channel of the memory cell MC, the source side select gate transistor STS, and the drain side select gate transistor STD. The tunnel insulating layer 123 is configured from an insulating layer of the likes of silicon oxide ($SiO_2$), for example. The charge accumulation layer 124 is configured from an insulating layer of the likes of silicon nitride (SiN), for example, capable of accumulating a charge. The block insulating layer 125 is configured from an insulating layer of the likes of silicon oxide ($SiO_2$), for example.

A material of the semiconductor layer 122 is conceivably configured from a semiconductor of the likes of SiGe, SiC, Ge, and C, for example, besides the above-described polysilicon. Moreover, a silicide may be formed at a contact surface of the semiconductor layer 122 with the substrate 101 or the conductive layer 106. Conceivably used in such a silicide are, for example, Sc, Ti, VCr, Mn, Fe, Co, Ni, Cu, Zn, Rh, Pd, Ag, Cd, In, Sn, La, Hf, Ta, W, Re, Os, Ir, Pt, Au, and so on. Furthermore, the following may be added to the silicide formed in this way, namely, Sc, Ti, VCr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, Au, and so on.

The tunnel insulating layer 123 or the block insulating layer 125 are conceivably configured from a material of, for example, an oxide or an oxynitride, besides the above-described silicon oxide ($SiO_2$).

Conceivable as the oxide configuring the tunnel insulating layer 123 and the block insulating layer 125 are, for example, $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, and so on.

Moreover, the oxide configuring the tunnel insulating layer 123 and the block insulating layer 125 may be $AB_2O_4$. Note that, A and B referred to here are the same or different elements, and are one of Al, Sc, Ti, V, Cr, Mn, Fe, Co, Ni, Cu, Zn, Ga, and Ge. For example, $AB_2O_4$ is $Fe_3O_4$, $FeAl_2O_4$, $Mn_{1+x}Al_{2-x}O_{4+y}$, $Co_{1+x}Al_{2-x}O_{4+y}$, $MnO_x$, and so on.

Moreover, the oxide configuring the tunnel insulating layer 123 and the block insulating layer 125 may be $ABO_3$. Note that, A and B referred to here are the same or different elements, and are one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn. For example, $ABO_3$ is $LaAlO_3$, $SrHfO_3$, $SrZrO_3$, $SrTiO_3$, and so on.

Conceivable as the oxynitride configuring the tunnel insulating layer 123 and the block insulating layer 125 are, for example, SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON, and so on.

Moreover, the oxynitride configuring the tunnel insulating layer 123 and the block insulating layer 125 may be a material in which some of the oxygen elements of each of the materials mentioned above as the oxide configuring the tunnel insulating layer 123 and the block insulating layer 125 are substituted by a nitrogen element.

Note that the following are preferable as the material of the tunnel insulating layer 123 and the block insulating layer 125, namely, $SiO_2$, SiN, $Si_3N_4$, $Al_2O_3$, SiON, $HfO_2$, HfSiON, $Ta_2O_5$, $TiO_2$, or $SrTiO_3$.

Specifically, Si based insulating films of the likes of $SiO_2$, SiN, and SiON include ones in which concentrations of oxygen elements and nitrogen elements are each $1 \times 10^{18}$ atoms/cm$^3$ or more.

Moreover, the tunnel insulating layer 123 and the block insulating layer 125 may include an impurity atom forming a defect level or a semiconductor/metal dot (quantum dot).

Figure 5:
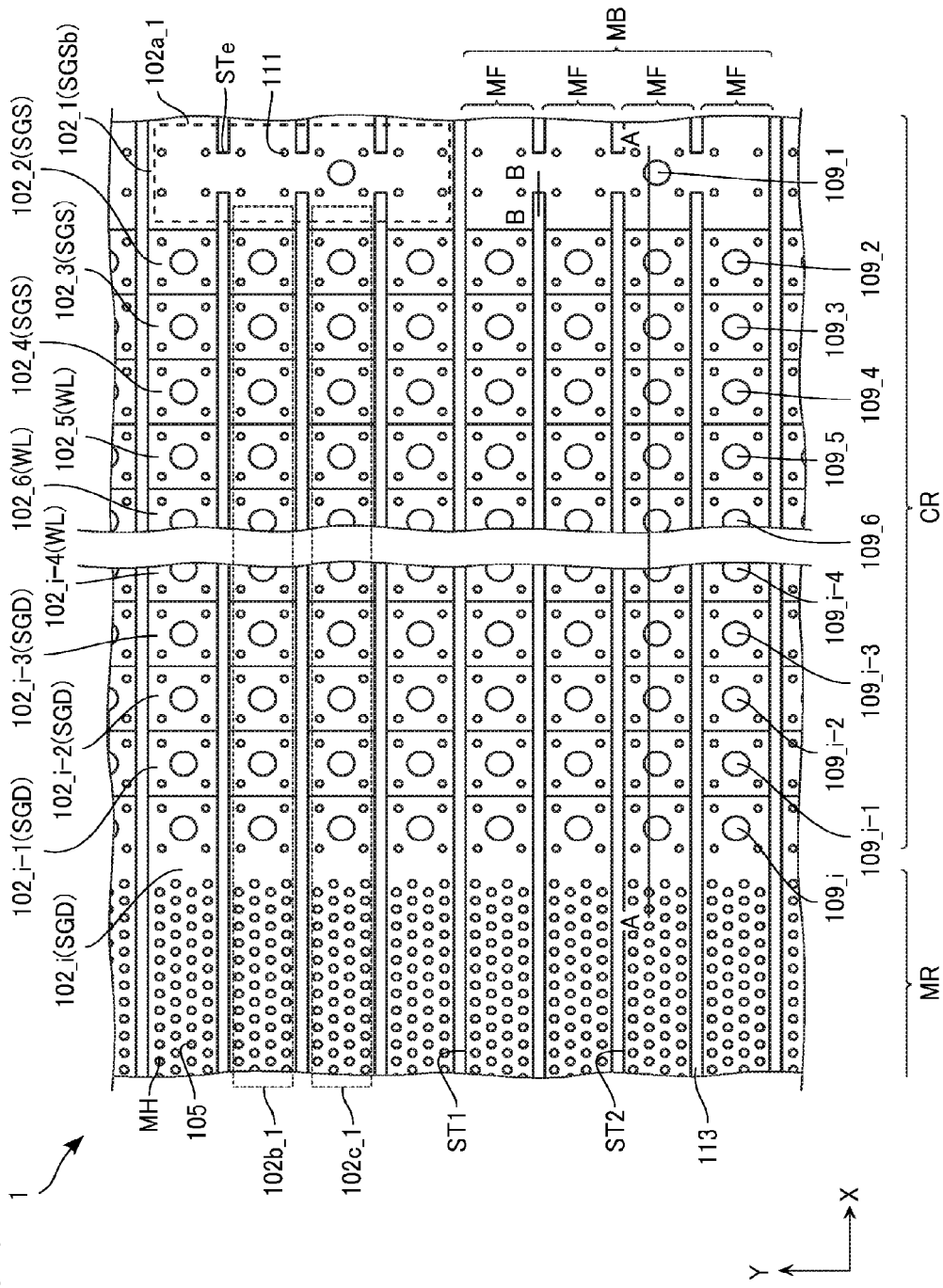
FIG. 5 is a plan view showing the configuration of the memory cell array 1 of the same semiconductor memory device.
Figure 6:
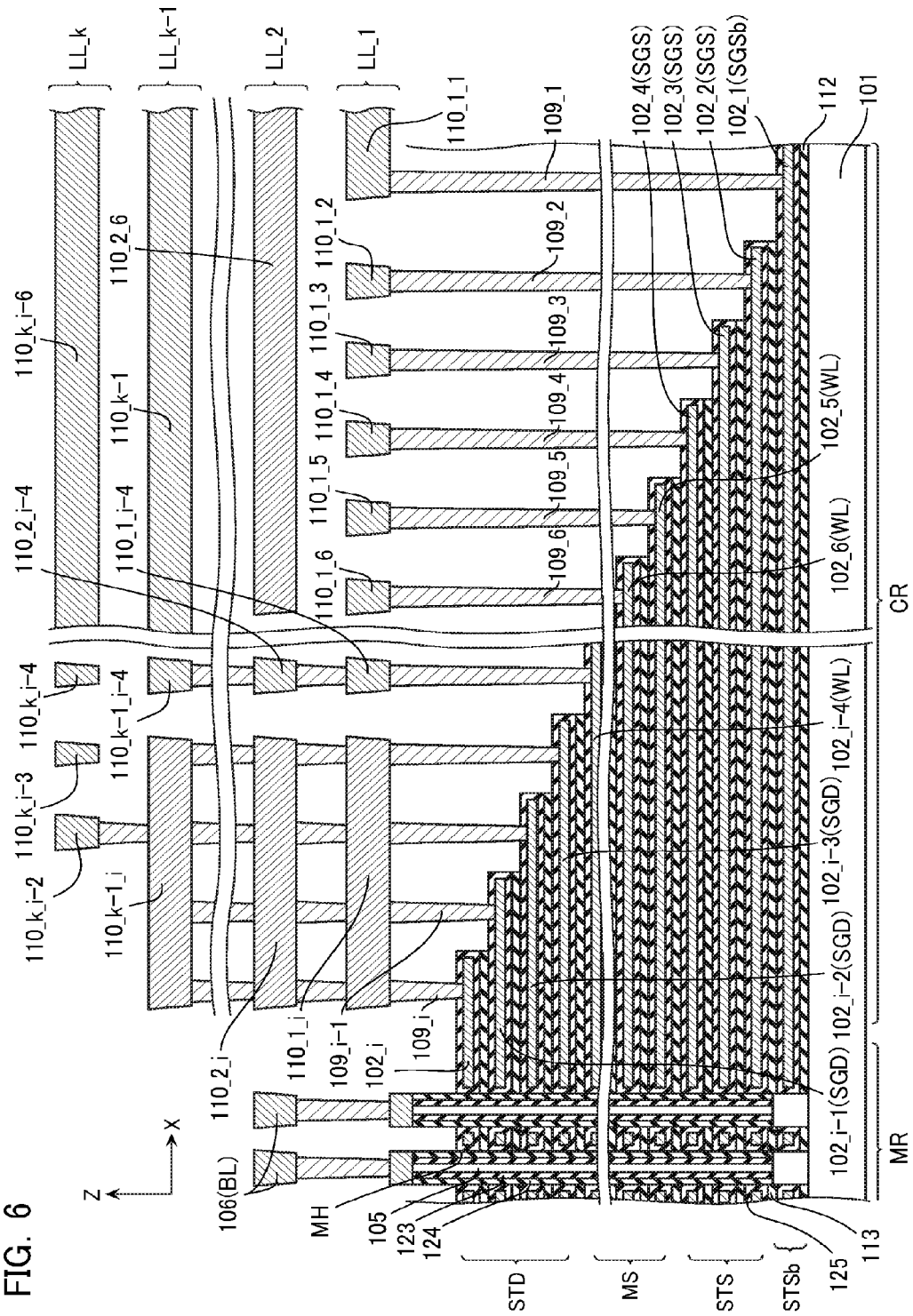
FIG. 6 is a cross-sectional view showing the configuration of the memory cell array 1 of the same semiconductor memory device.
Figure 7:
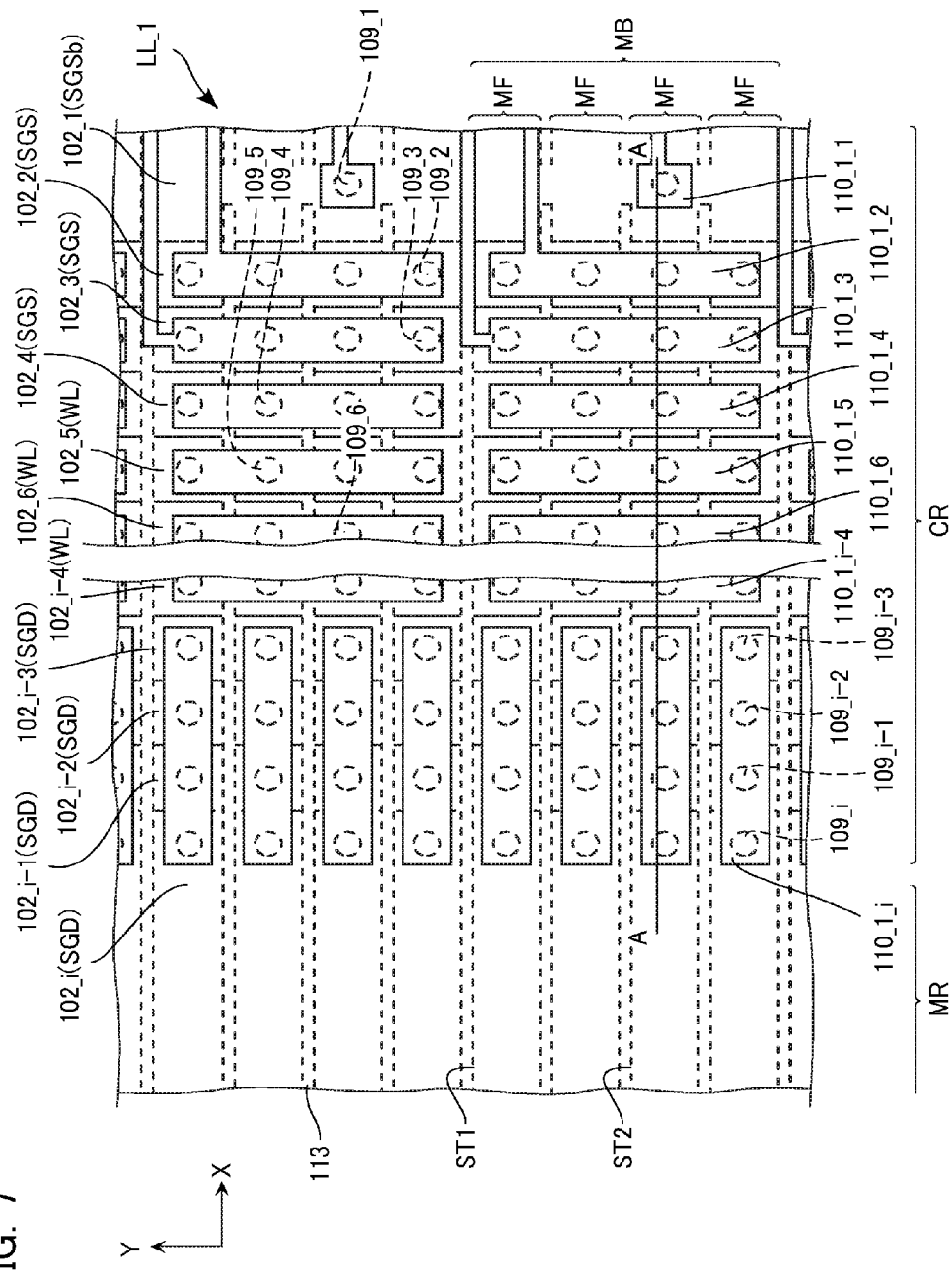
FIG. 7 is a plan view showing a configuration of a wiring line layer LL_1 of the same semiconductor memory device.
Figure 8:
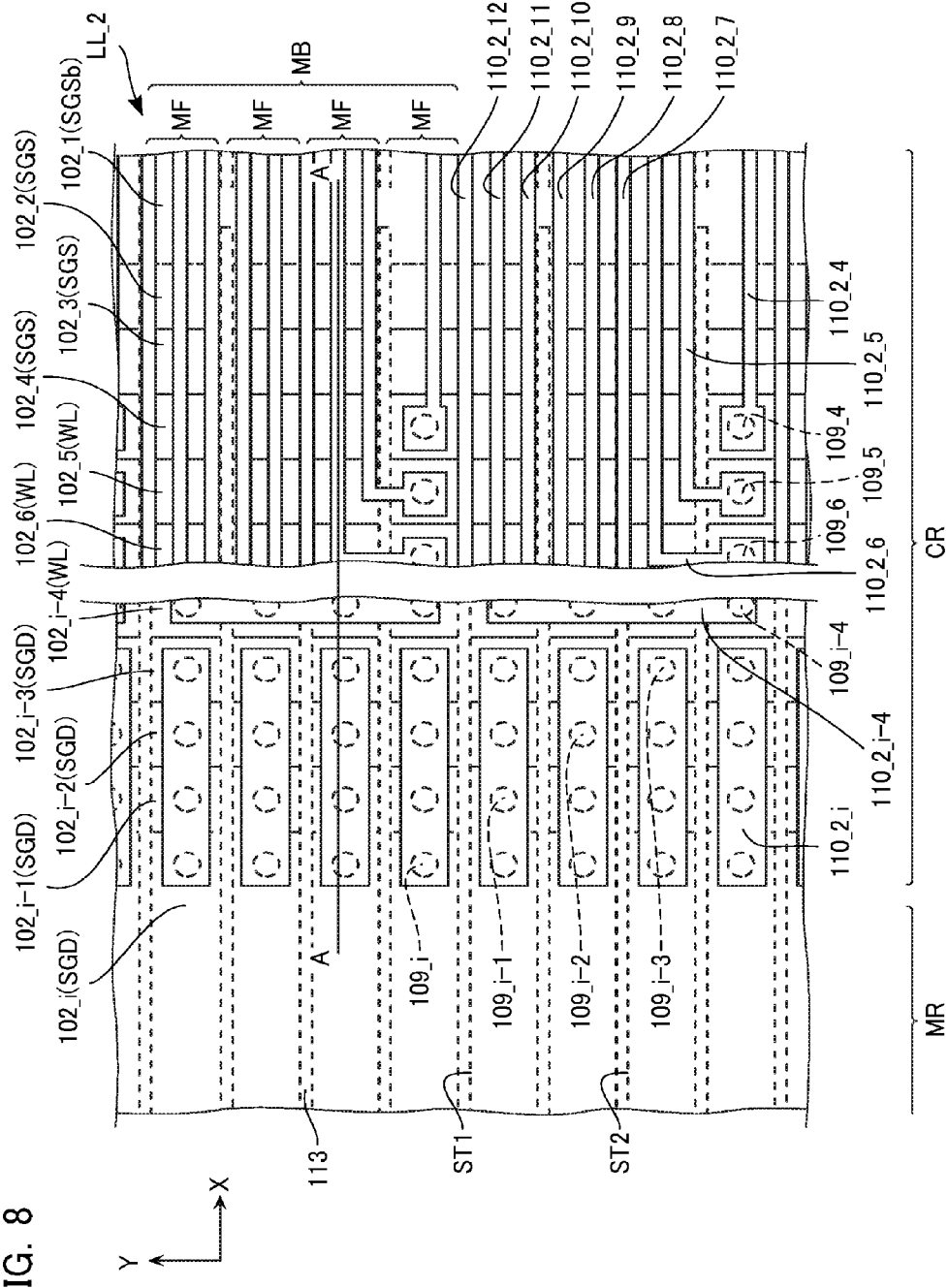
FIG. 8 is a plan view showing a configuration of a wiring line layer LL_2 of the same semiconductor memory device.
Figure 9:
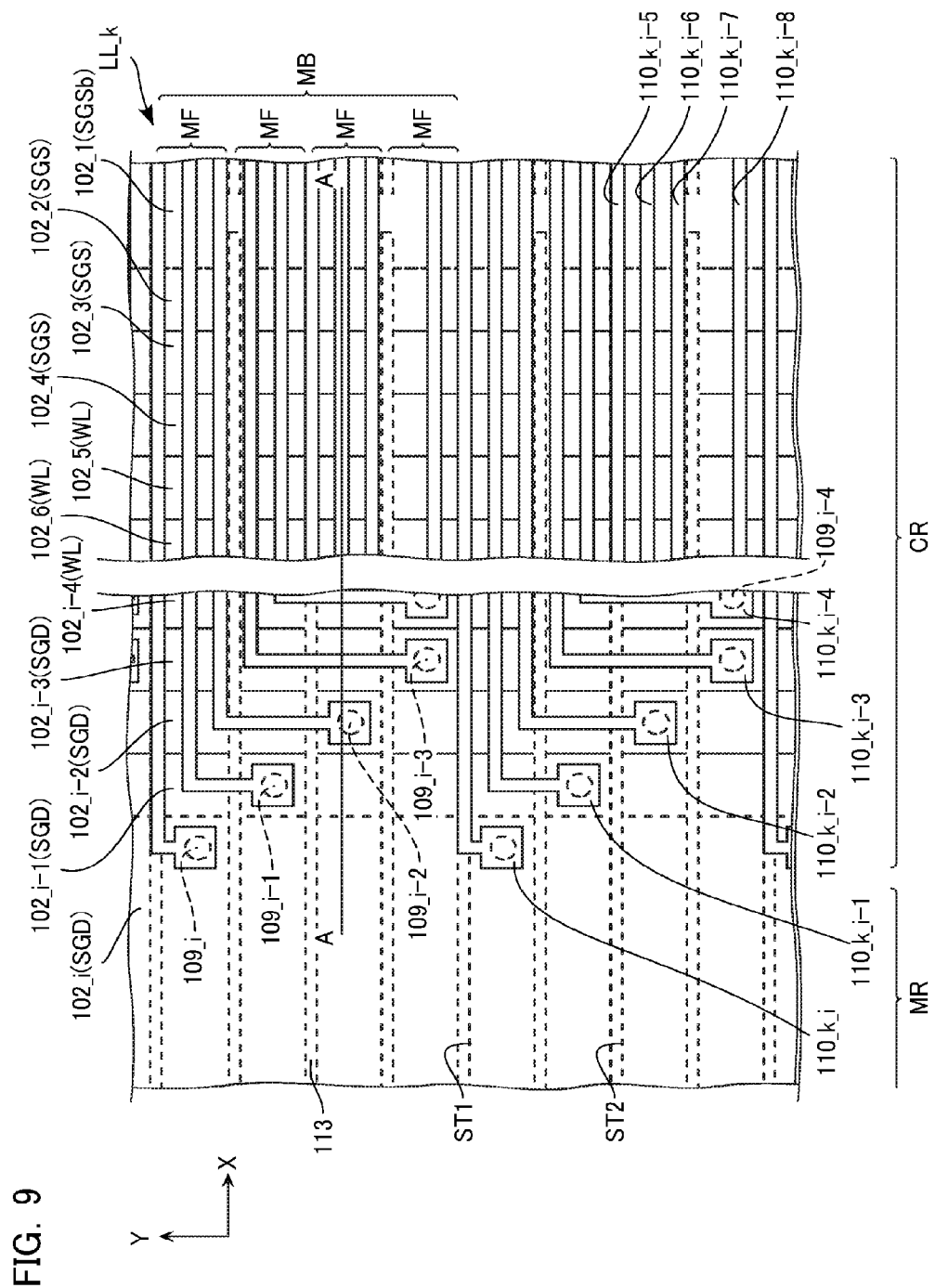
FIG. 9 is a plan view showing a configuration of a wiring line layer LL_k of the same semiconductor memory device.

Next, the configuration of the semiconductor memory device according to the first embodiment will be described in more detail with reference to FIGS. 5 to 9. FIG. 5 is a plan view showing a configuration of part of the memory cell array 1. FIG. 6 is a cross-sectional view of the same memory block, and shows a cross-section taken along the line AA of FIG. 5. Moreover, FIGS. 7 to 9 are plan views of the same memory block, and respectively illustrate wiring line layers LL_1, LL_2, and LL_k shown in FIG. 6. Note that in each of FIGS. 5 to 9, part of the configuration is omitted. Moreover, the configurations shown in FIGS. 5 to 9 are merely examples, and configurations, and so on, of the wiring line layers LL_1, LL_2, and LL_k may be appropriately changed.

As shown in FIG. 5, the memory cell array 1 includes a plurality of the memory blocks MB arranged in the Y direction. Moreover, the memory block MB includes a plurality of the memory fingers MF arranged in the Y direction. Furthermore, provided in the memory finger MF are a memory region MR where the memory cell MC is positioned, and a contact region CR where the contact portion 102a is positioned. Moreover, as shown in FIG. 6, the memory finger MF includes i (i is a positive integer) layers of conductive layers 102_1 to 102_i.

As shown in FIG. 5, the memory region MR of the conductive layers 102_1 to 102_i is provided with a plurality of memory holes MH. These memory holes MH are provided in a staggered shape in the XY directions. Note that an arrangement in the XY directions of the memory holes MH may be appropriately adjusted to a triangular arrangement or a square arrangement, and so on. Moreover, as shown in FIG. 6, the memory hole MH is a through hole that penetrates the conductive layers 102_1 to 102_i, and the inside of the memory hole MH is provided with the memory columnar body 105, the tunnel insulating layer 123, and the charge accumulation layer 124 described with reference to FIG. 4. Moreover, the conductive layers 102_1 to 102_i are covered by the block insulating layer 125, and are stacked on the substrate 101 via an insulating layer 112.

As shown in FIG. 6, in the present embodiment, the lowermost layer source side select gate transistor STSb is provided at an intersection of a one-layer portion of the conductive layers 102 and the memory columnar body 105. Moreover, the source side select gate transistor STS is provided at an intersection of a three-layer portion of the conductive layers 102 and the memory columnar body 105. Furthermore, the drain side select gate transistor STD is provided at an intersection of a four-layer portion of the conductive layers 102 and the memory columnar body 105. Therefore, in the present embodiment, the conductive layer 102_1 functions as the lowermost layer source side select gate line SGSb and as the control gate electrode of the lowermost layer source side select gate transistor STSb; the conductive layers 102_2 to 102_4 function as the source side select gate line SGS and as the control gate electrode of the source side select gate transistor STS; the conductive layers 102_5 to 102_i-4 function as the word lines WL and as the control gates of the memory cells MC; and the conductive layers 102_i-3 to 102_i function as the drain side select gate line SGD and as the control gate electrode of the drain side select gate transistor STD.

As shown in FIG. 5, the conductive layers 102_2 to 102_i are arranged in plurality in the Y direction via a first trench ST1 and a second trench ST2 that extend in the X direction. The first trench ST1 is positioned at a boundary of the plurality of memory blocks MB. The second trench ST2 is positioned at a boundary of the plurality of memory fingers MF. Moreover, as shown in FIG. 5, the conductive layers 102_1 are arranged in plurality in the Y direction via the first trench ST1 extending in the X direction. A width in the Y direction of the conductive layer 102_1 is larger than widths in the Y direction of the other conductive layers 102_2 to 102_i. For example, in the example shown in FIG. 5, the width in the Y direction of the conductive layer 102_1 is approximately four times the widths in the Y direction of the other conductive layers 102_2 to 102_i. Moreover, the first trench ST1 and the second trench ST2 are implanted with an insulating layer 113 and the unillustrated conductive layer 108 (source contact LI, refer to FIG. 3). Note that the insulating layer 113 is positioned on each of both side surfaces in the Y direction of the conductive layer 108.

As shown in FIG. 5, the conductive layer 102_1 includes in a contact portion 102a_1 thereof a continuous portion not divided by the second trench ST2. That is, a terminal portion STe in the X direction of the second trench ST2 is positioned in the contact portion 102a_1 of the conductive layer 102_1. Therefore, the terminal portion STe in the X direction of the insulating layer 113 implanted in the second trench ST2 faces the contact portion 102a_1 from the X direction. Note that the continuous portion extends in the Y direction. The conductive layer 102_1 comprises separated portions 102b_1 (first portion) and 102c_1 (second portion) that extend in the X direction and are separated in the Y direction via the second trench ST2, and these plurality of separated portions 102b_1 and 102c_1 are commonly connected by the contact portion 102a_1 (third portion). Note that lengths in the X direction of the separated portions 102b_1 and 102c_1 are larger than a length in the X direction of the contact portion 102a_1. Moreover, the plurality of separated portions 102b_1 and 102c_1 each have a plurality of the conductive layers 102_2 to 102_i stacked thereon.

As shown in FIG. 6, the conductive layers 102_1 to 102_i are respectively connected to via contact wiring lines 109_1 to 109_i that have the Z direction as their longer direction. As shown in FIG. 5, the via contact wiring line 109_1 is provided one to every one memory block MB. Moreover, as shown in FIG. 5, the via contact wiring lines 109_2 to 109_i are provided one to every one memory finger MF.

As shown in FIG. 6, the via contact wiring lines 109_1 to 109_i are respectively connected to the wiring lines 110 provided in the wiring line layers LL_1 to LL_k, and are connected to the row decoders 2 and 3 (FIGS. 1 and 2) via these wiring lines 110. As shown in FIG. 6, in the present embodiment, the plurality of conductive layers 102_1 to 102_i are formed in steps, hence the lower a layer in which a conductive layer 102 is positioned, the more distant is a position from the memory region MR at which its contact portion 102a is provided, and the higher a layer in which a conductive layer 102 is positioned, the closer is a position to the memory region MR at which its contact portion 102a is provided. Moreover, the lower a layer in which a conductive layer 102 is positioned, the lower positioned is the layer of the wiring line 110 by which it is led out in the X direction, and the higher a layer in which a conductive layer 102 is positioned, the higher positioned is the layer of the wiring line 110 by which it is led out in the X direction.

As shown in FIG. 7, the wiring line layer LL_1 is provided with a plurality of wiring lines 110_1_1 to 110_1_i-4. The wiring line 110_1_1 comprises a portion connected to the via contact wiring line 109_1 and a portion led out in the X direction. The wiring lines 110_1_2 to 110_1_i-4 respectively include portions that extend in the Y direction and are commonly connected to a plurality of (four in the example shown in FIG. 7) via contact wiring lines 109_2 to 109_i-4. The portions extending in the Y direction of these wiring lines 110_1_2 to 110_1_i-4 respectively commonly electrically connect the conductive layers 102_2 to 102_i-4 divided in the Y direction by the second trench ST2. Moreover, the wiring line 110_1_2 and the wiring line 110_1_3 further include a portion extending in the X direction avoiding the wiring line 110_1_1. Moreover, the wiring line layer LL_1 is provided with a wiring line 110_1_*i* on a memory finger MF basis. The wiring lines 110_1_*i* respectively commonly connect on a memory finger MF basis the conductive layers 102_*i*-3 to 102_*i* that extend in the X direction and function as the drain side select gate line SGD.

As shown in FIG. 8, wiring lines 110_2_4 to 110_2_12 in the wiring line layer LL_2 comprise portions connected to the conductive layers 102_4 to 102_12 and portions led out in the X direction. Similarly, the wiring lines 110 in the wiring line layers LL_3 to LL_k are connected to the conductive layers 102_13 to 102_*i*-4, and are led out in the X direction. Moreover, as shown in FIG. 9, wiring lines 110_*k*_*i*-3 to 110_*k*_*i* in the uppermost layer wiring line layer LL_k comprise portions respectively connected independently to the plurality of wiring lines 110_1_*i* and portions led out in the X direction.

In the semiconductor memory device according to the present embodiment, the word lines WL and the source side select gate line SGS are commonly connected to the plurality of memory fingers MF included in one memory block MB. This makes it possible to reduce the number of wiring lines 110 and furthermore to reduce the number of layers k of the wiring line layers LL_1 to LL_k described with reference to FIGS. 5 to 9, thereby reducing manufacturing costs of the semiconductor memory device.

Moreover, as described with reference to FIG. 5, in the present embodiment, the conductive layer 102_1 includes a continuous portion not divided by the second trench ST2. Therefore, as mentioned above, it is possible for the conductive layer 102_1 to be connected to the wiring line 110_1_1 in the wiring line layer LL_1 by one via contact wiring line 109_1. Therefore, there is no need for the wiring line 110_1_1 to be provided with a portion extending in the Y direction for connecting to a plurality of the via contact wiring lines. Therefore, it is possible to increase the number of wiring lines 110 led out in the X direction in the wiring line layer LL_1 to further reduce the number of wiring lines 110.

Moreover, as shown in FIG. 7, the wiring line 110_1_1 connected to the conductive layer 102_1 positioned in a lowermost layer is provided at a position furthest from the memory region MR. Therefore, by omitting the portion extending in the Y direction for connecting to the plurality of via contact wiring lines in such a wiring line 110_1_1, it is possible to suitably secure a space for leading out in the X direction another wiring line in the wiring line layer LL_1 and to suitably increase the number of wiring lines 110 led out in the X direction in the wiring line layer LL_1 positioned in a lowermost layer.

Note that in the present embodiment, only the conductive layer 102_1 positioned in a lowermost layer of the plurality of conductive layers 102_1 to 102_*i* includes the continuous portion not divided by the second trench ST2. However, it is also possible for the other conductive layers 102_2 to 102_*i* to be provided with such a continuous portion, and it is also possible for a plurality of the conductive layers from among these conductive layers 102_2 to 102_*i* to be selected as an undivided conductive layer. For example, it is also conceivable for the continuous portion not divided by the second trench ST2 to be provided to all of the conductive layers 102 positioned comparatively downwardly and led out in the X direction by the wiring line 110 in the wiring line layer LL_1. As a result, the plurality of wiring lines 110 connected to these plurality of conductive layers 102 can have the above-described portion extending in the Y direction omitted, and the number of wiring lines 110 in the wiring line layer LL_1 positioned in a lowermost layer can be increased to a maximum. Note that the conductive layers 102_*i*-3 to 102_*i* operate as the drain side select gate line SGD and as the gate electrode of the drain side select gate transistor STD. Therefore, in the case where at least one of the conductive layers 102_*i*-3 to 102_*i* is selected as an undivided conductive layer, it is also conceivable that the source side select gate line SGS, for example, is provided electrically independently on a memory finger MF basis.

Second Embodiment

Figure 10:
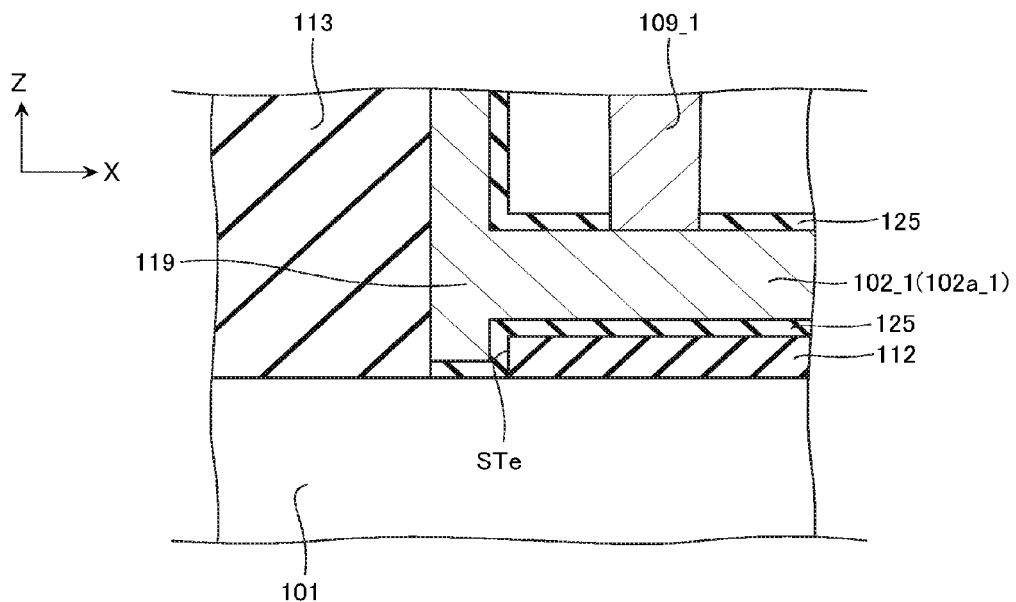
FIG. 10 is a schematic cross-sectional view for explaining a phenomenon that may occur when manufacturing the same semiconductor memory device.

Next, a semiconductor memory device according to a second embodiment will be described with reference to FIGS. 10 to 13. FIG. 10 is a schematic cross-sectional view for explaining a phenomenon that may occur when manufacturing the semiconductor memory device according to the first embodiment, and shows a cross-section taken along the line BB of FIG. 5.

When manufacturing the semiconductor memory device according to the first embodiment, it is conceivable to, for example, stack a plurality of layer portions of the insulating layers 112 and sacrifice layers, form the first trench ST1 and the second trench ST2 in the insulating layers 112 and sacrifice layers, remove the sacrifice layers, deposit a conductive layer of the likes of a metal in this portion where the sacrifice layer has been removed, and remove the conductive layer formed on a sidewall, and so on, of the insulating layer 112.

Now, as described with reference to FIG. 5, in the first embodiment, the second trench ST2 extends to the contact portion 102*a*_1 of the conductive layer 102_1. Now, the above-described conductive layer of the likes of a metal is deposited also in this second trench ST2. Now, it is sometimes difficult for a portion positioned at the terminal portion STe of the second trench ST2 of the deposited conductive layer to be easily removed, compared with another portion. Therefore, as shown in FIG. 10, the terminal portion STe in the X direction of the second trench ST2 sometimes ends up having a conductive residue 119 formed therein. Now, as shown in FIG. 10, an insulating layer forming the block insulating layer 125 is sometimes interposed between the residue 119 of the conductive layer and the substrate 101. However, a comparatively large voltage is applied between the substrate 101 and the conductive layer 102*a*_1. In contrast, a film thickness of the block insulating layer 125 is about several nm. Therefore, sometimes, when the comparatively large voltage is applied between the substrate 101 and the conductive layer 102*a*_1, dielectric breakdown occurs in the block insulating layer 125 and the conductive layer 102_1 ends up short-circuiting with the substrate 101 via the residue 119.

Figure 11:
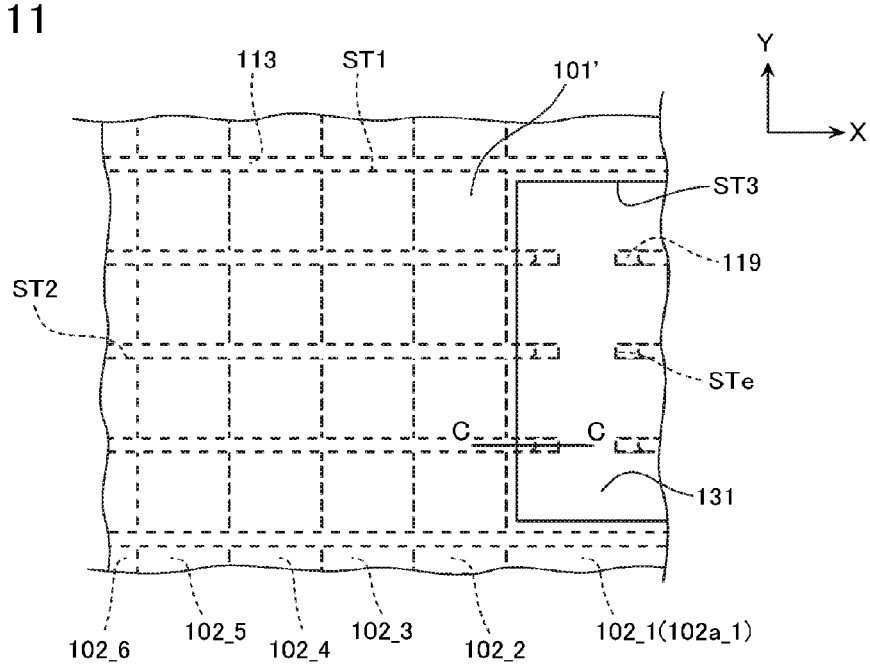
FIG. 11 is a plan view showing part of an upper surface of a substrate 101' of a semiconductor memory device according to a second embodiment.
Figure 12:
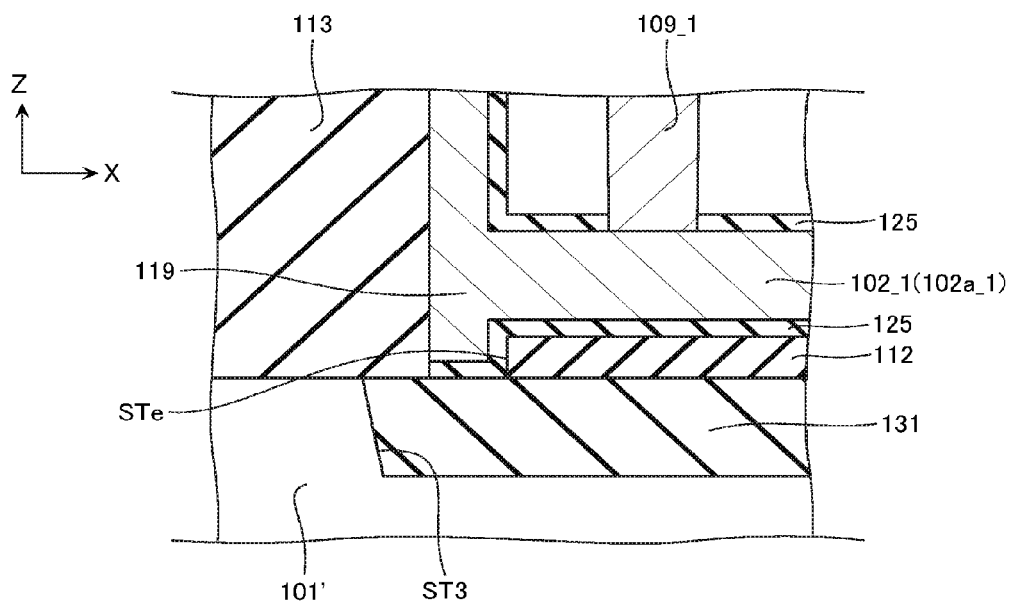
FIG. 12 is a cross-sectional view showing a configuration of part of the same semiconductor memory device.

Next, a configuration of the semiconductor memory device according to the second embodiment will be described with reference to FIGS. 11 and 12. FIG. 11 is a plan view showing part of an upper surface of a substrate 101' of the same semiconductor memory device, and shows a portion facing the contact portion 102*a*_1 of the conductive layer 102_1 (refer to FIG. 5). Moreover, FIG. 12 is a cross-sectional view showing a configuration of part of the same semiconductor memory device, and shows a cross-section taken along the line CC of FIG. 11. Note that in the description below, portions similar to those of the semiconductor memory device according to the first embodiment are assigned with identical reference symbols to those assigned in the first embodiment, and descriptions thereof will be omitted.

The semiconductor memory device according to the present embodiment is basically configured similarly to the semiconductor memory device according to the first embodiment, but a configuration of part of the substrate 101' is different to that of the first embodiment. That is, as shown in FIG. 11, in the present embodiment, a third trench ST3 is formed in an upper surface of the substrate 101', and an insulating layer 131 is implanted therein. As shown in FIG. 11, in the present embodiment, the third trench ST3 and the insulating layer 131 are provided in a portion facing the contact portion 102_a of the conductive layer 102_1, of the upper surface of the substrate 101'. Moreover, the insulating layer 131 is provided in a region overlapping a plurality of the terminal portions STe of the second trenches ST2 and a plurality of the residues 119, as seen from the Z direction. Note that the insulating layer 131 is formed from, for example, silicon oxide (SiO$_2$).

As shown in FIG. 12, the conductive layer 102_1 contacts the residue 119 at the contact portion 102a_1. Moreover, the residue 119 contacts the substrate 101' via the block insulating layer 125. However, a portion where the residue 119 is positioned of the substrate 101' is provided with the insulating layer 131. Therefore, in the present embodiment, contact between the conductive layer 102_1 and the substrate 101' can be suitably prevented.

Figure 13:
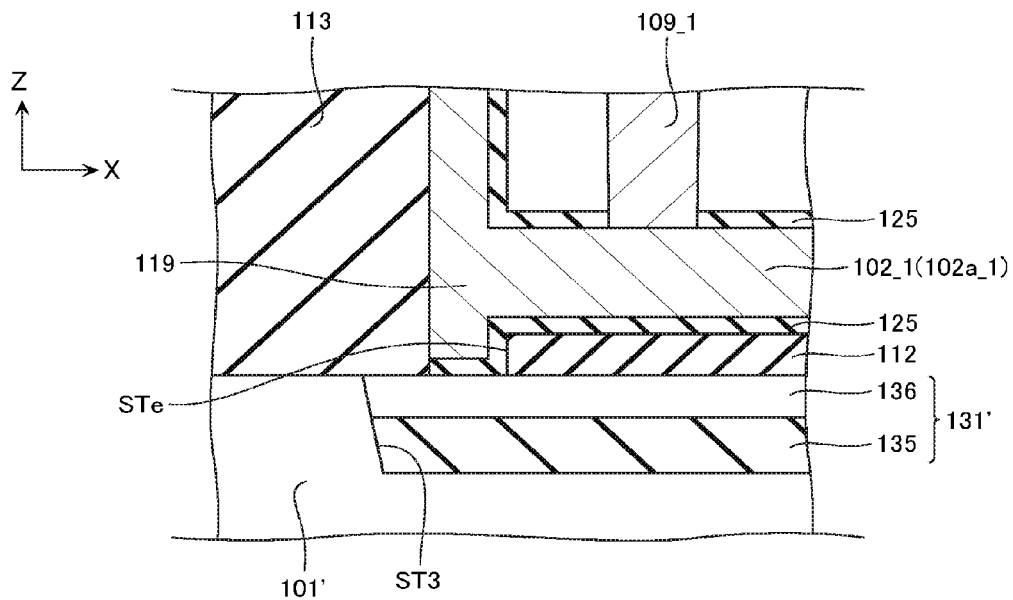
FIG. 13 is a cross-sectional view showing a modified example of the same semiconductor memory device.

Note that in the example shown in FIG. 12, the insulating layer 131 configured from a single insulating layer is formed in the third trench ST3. However, as shown in FIG. 13, an insulating layer 131' having a stacked structure may be formed in the third trench ST3. For example, the insulating layer 131' may have a stacked structure of a lower layer 135 configured from silicon oxide, and an upper layer 136 configured from the likes of an aluminum oxide such as alumina (Al$_2$O$_3$), silicon nitride (SiN), or polysilicon not including an impurity. Even when the insulating layer 131' having the stacked structure is adopted in this way, an electrical resistance value of the lower layer 135 and the upper layer 136 can be raised and the above-described short-circuiting between the conductive layer 102_1 and the substrate 101' can be prevented. Moreover, when the insulating layer 131' having such a stacked structure is adopted, materials of the insulating layer 112 removed when the second trench ST2 is formed and the upper layer 136 of the insulating layer 131' can be made different, and the upper layer 136 can be used as an etching stopper.

Third Embodiment

Figure 14:
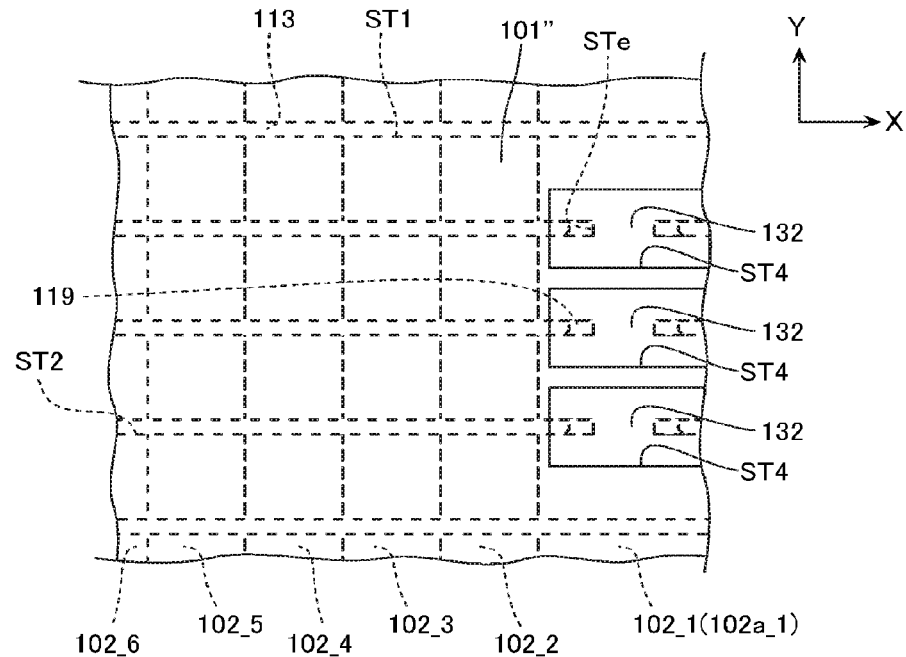
FIG. 14 is a plan view showing part of an upper surface of a substrate 101" of a semiconductor memory device according to a third embodiment.
Figure 15:
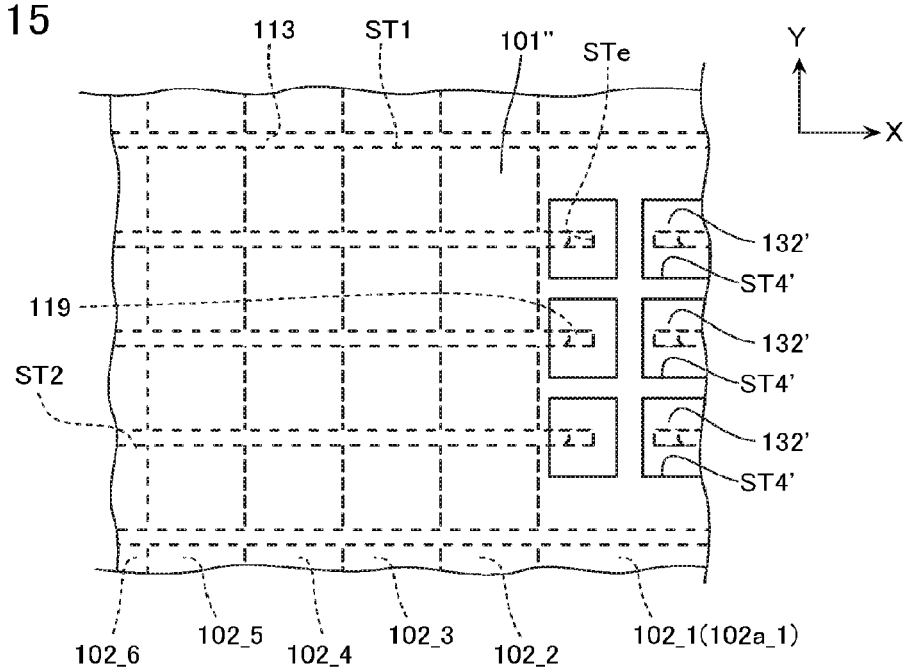
FIG. 15 is a plan view showing a modified example of the same semiconductor memory device.

Next, a semiconductor memory device according to a third embodiment will be described with reference to FIGS. 14 and 15. FIG. 14 is a plan view showing part of an upper surface of a substrate 101" of the same semiconductor memory device, and shows a portion facing the contact portion 102a_1 of the conductive layer 102_1. Note that in the description below, portions similar to those of the semiconductor memory device according to the second embodiment are assigned with identical reference symbols to those assigned in the second embodiment, and descriptions thereof will be omitted.

The semiconductor memory device according to the present embodiment is basically configured similarly to the semiconductor memory device according to the second embodiment, but a configuration of part of the substrate 101" is different to that of the second embodiment. That is, as described with reference to FIG. 11, in the second embodiment, one third trench ST3 and insulating layer 131 was provided per one memory block MB, and the insulating layer 131 was provided in a region overlapping a plurality of the terminal portions STe of the second trenches ST2 and a plurality of the residues 119, as seen from the Z direction. In contrast, in the present embodiment, as shown in FIG. 14, a plurality of fourth trenches ST4 and insulating layers 132 are provided per one memory block MB. Moreover, these plurality of fourth trenches ST4 and insulating layers 132 are each provided in a region overlapping the terminal portion STe of the second trench ST2 and the residue 119, as seen from the Z direction.

The fourth trench ST4 according to the present embodiment has an area in the XY plane which is smaller compared to that of the third trench ST3 according to the second embodiment. Therefore, it is possible to suppress a phenomenon (dishing) in which the substrate gets deeply carved when the trench is formed in the substrate.

Note that an insulating layer 132 having a stacked structure may be adopted also in the present embodiment, similarly to in the second embodiment. Moreover, as shown in FIG. 15, it is also possible to adopt fourth trenches ST4' divided in the X direction and the Y direction and insulating layers 132' implanted in these fourth trenches ST4'. As a result, the above-described dishing can be even more suitably suppressed.

Fourth Embodiment

Figure 16:
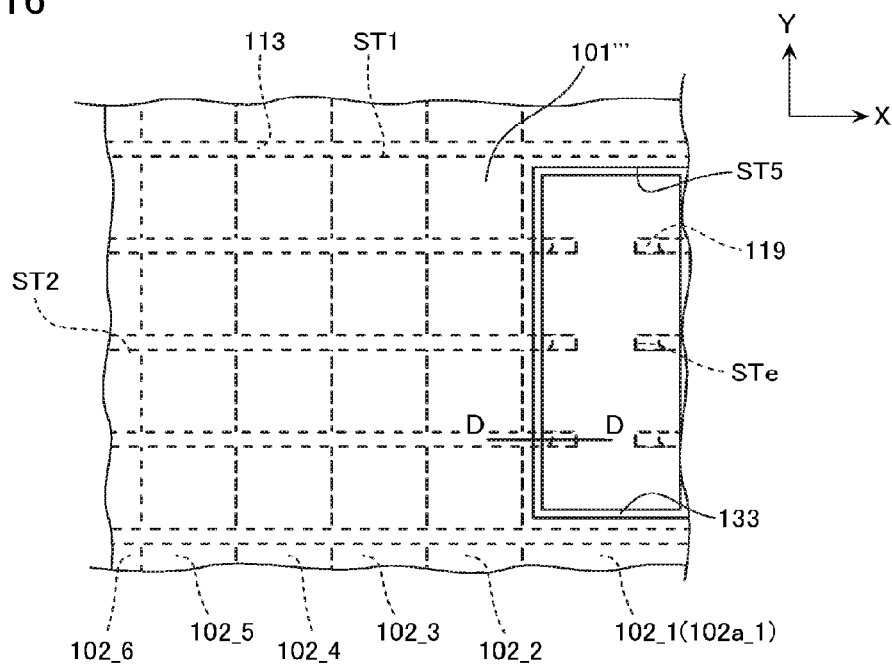
FIG. 16 is a plan view showing part of an upper surface of a substrate 101''' of a semiconductor memory device according to a fourth embodiment.
Figure 17:
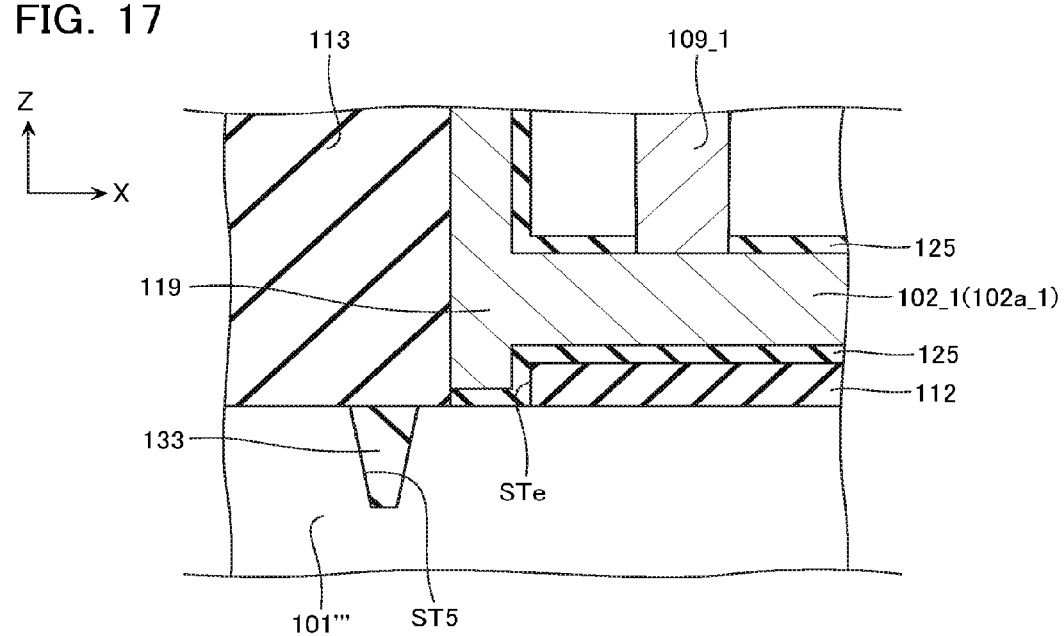
FIG. 17 is a cross-sectional view showing a configuration of part of the same semiconductor memory device.

Next, a semiconductor memory device according to a fourth embodiment will be described with reference to FIGS. 16 to 19. FIG. 16 is a plan view showing part of an upper surface of a substrate 101''' of the same semiconductor memory device, and shows a portion facing the contact portion 102a_1 of the conductive layer 102_1. Moreover, FIG. 17 is a cross-sectional view showing a configuration of part of the same semiconductor memory device, and shows a cross-section taken along the line DD of FIG. 16. Note that in the description below, portions similar to those of the semiconductor memory device according to the second embodiment are assigned with identical reference symbols to those assigned in the second embodiment, and descriptions thereof will be omitted.

The semiconductor memory device according to the present embodiment is basically configured similarly to the semiconductor memory device according to the second embodiment, but a configuration of part of the substrate 101''' is different to that of the second embodiment. That is, as described with reference to FIG. 11, the insulating layer 131 according to the second embodiment was provided in a region overlapping the terminal portion STe of the second trench ST2 and the residue 119, as seen from the Z direction. In contrast, in the present embodiment, as shown in FIG. 16, a certain region overlapping the terminal portion STe of the second trench ST2 and the residue 119, of the portion facing the contact portion 102a_1 of the conductive layer 102_1, of the substrate 101''' is surrounded by a fifth trench ST5 and an insulating layer 133 implanted in the fifth trench ST5, as seen from the Z direction. Note that the insulating layer 133 is formed from, for example, silicon oxide (SiO$_2$).

As shown in FIG. 17, the conductive layer 102_1 contacts the residue 119 at the contact portion 102a_1. Moreover, the residue 119 contacts the substrate 101''' via the block insulating layer 125. However, as shown in FIG. 16, a portion where the residue 119 is positioned of the substrate 101''' is electrically divided from another portion of the substrate 101''' by the fifth trench ST5 and the insulating layer 133.

Therefore, in the present embodiment also, contact between the conductive layer 102_1 and the substrate 101''' can be suitably prevented.

Moreover, as shown in FIG. 16, in the present embodiment, the linear fifth trench ST5 is formed in an outline portion of a region divided from the other portion of the upper surface of the substrate 101''', and the above-described region is surrounded by this fifth trench ST5. Therefore, the area in the XY plane of the trench formed in the substrate upper surface is smaller compared to in the second and third embodiments where a planar trench is formed in the substrate upper surface. Therefore, the above-described dishing can be even more suitably suppressed.

Figure 18:
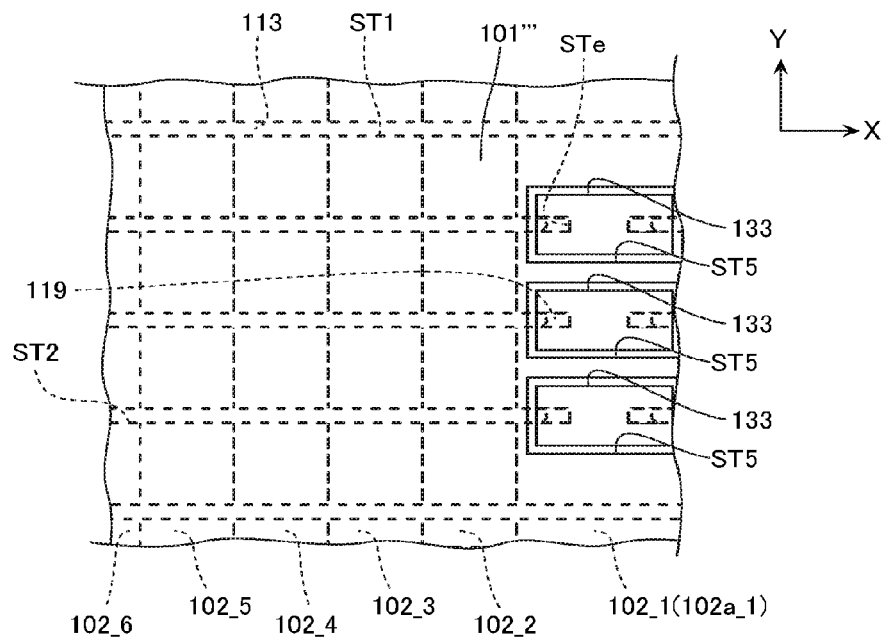
FIG. 18 is a plan view showing a modified example of the same semiconductor memory device.
Figure 19:
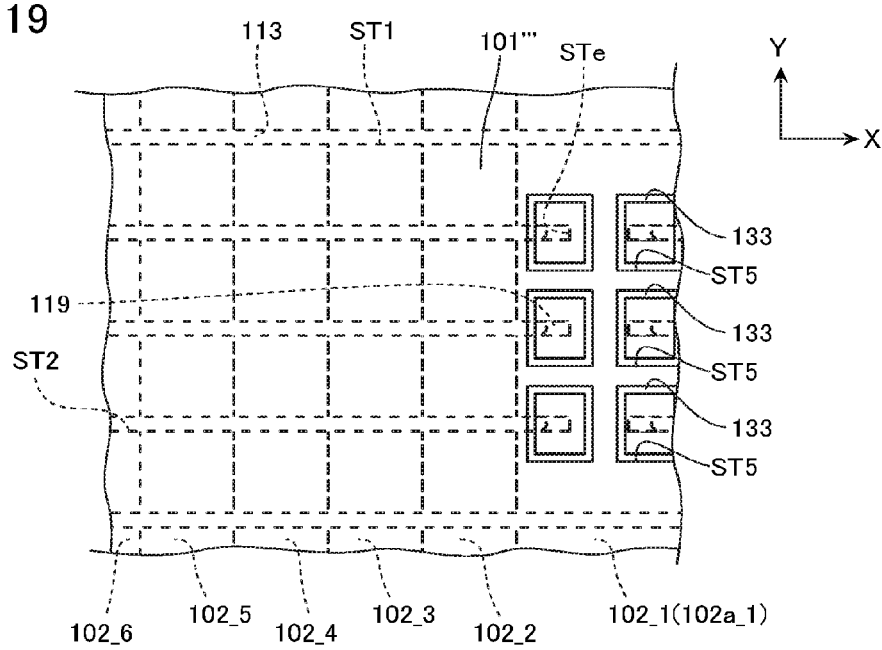
FIG. 19 is a plan view showing a modified example of the same semiconductor memory device.

Note that as shown in FIGS. 18 and 19, a plurality of the fifth trenches ST5 and insulating layers 133 may be provided per one memory block MB also in the present embodiment, similarly to in the third embodiment. Furthermore, these plurality of fifth trenches ST5 and insulating layers 133 may each surround a certain region overlapping the terminal portion STe of the second trench ST2 and the residue 119, of the upper surface of the substrate 101''', as seen from the Z direction. As a result, an area of a portion on the substrate 101''' connected to the conductive layer 102_1 via the residue 119 can be reduced, and an increase in parasitic capacitance or occurrence of a leak current, and so on, can be prevented. Moreover, a stacked structure may be adopted as the insulating layer 133 as described with reference to FIG. 13, for example, also in the present embodiment.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of control gate electrodes stacked above a substrate;
   a semiconductor layer extending in a direction perpendicular to the substrate, the semiconductor layer facing the plurality of control gate electrodes; and
   a charge accumulation layer positioned between the control gate electrode and the semiconductor layer,
   the plurality of control gate electrodes comprising:
   a first control gate electrode positioned in a lowermost layer of the plurality of control gate electrodes and including a first portion, a second portion and a third portion, the first portion extending in a first direction, the second portion being provided adjacent to the first portion and extending in the first direction, the third portion being connected to an end of the first portion and an end of the second portion, and the third portion being extending in a second direction crossing to the first direction;
   a plurality of second control gate electrodes stacked right above the first portion of the first control gate electrode; and
   a plurality of third control gate electrodes stacked right above the second portion of the first control gate electrode and being apart from the plurality of second control gate electrodes.

2. The semiconductor memory device according to claim 1, further comprising
   a first via contact being connected to the third portion of the first control gate electrode.

3. The semiconductor memory device according to claim 2, further comprising
   a second via contact being connected to the second control gate electrode, and
   a third via contact being connected to the third control gate electrode.

4. The semiconductor memory device according to claim 3, further comprising:
   a first wiring line connected to the first via contact; and
   a second wiring line commonly connected to the second via contact and the third via contact.

5. The semiconductor memory device according to claim 1, further comprising:
   a first insulating layer disposed between the first portion and the second portion of the first control gate electrode and provided along the first direction.

6. The semiconductor memory device according to claim 5, further comprising:
   a second insulating layer provided in an upper surface of the substrate,
   wherein the second insulating layer is provided in a region overlapping an end portion in the first direction of the first insulating layer, as seen from above the substrate.

7. The semiconductor memory device according to claim 6, comprising:
   a plurality of the first insulating layers,
   wherein the second insulating layer is provided in a region overlapping end portions in the first direction of the plurality of first insulating layers, as seen from above the substrate.

8. The semiconductor memory device according to claim 6, comprising:
   a plurality of the first insulating layers and the second insulating layers,
   wherein the plurality of second insulating layers are each provided in a region overlapping an end portion in the first direction of the first insulating layer, as seen from above the substrate.

9. The semiconductor memory device according to claim 5, further comprising:
   a third insulating layer provided in an upper surface of the substrate,
   wherein the third insulating layer surrounds a region overlapping an end portion in the first direction of the first insulating layer, as seen from above the substrate.

10. The semiconductor memory device according to claim 9, comprising:
    a plurality of the first insulating layers,
    wherein the third insulating layer surrounds a region overlapping end portions in the first direction of the plurality of first insulating layers, as seen from above the substrate.

11. The semiconductor memory device according to claim 9, comprising:
    a plurality of the first insulating layers and the third insulating layers,
    wherein the plurality of third insulating layers each surround a region overlapping an end portion in the first direction of the plurality of first insulating layers, as seen from above the substrate.

12. A semiconductor memory device, comprising:
a plurality of control gate electrodes stacked above a substrate;
a semiconductor layer extending in a direction perpendicular to the substrate, the semiconductor layer facing the plurality of control gate electrodes; and
a charge accumulation layer positioned between the control gate electrode and the semiconductor layer,
the plurality of control gate electrodes comprising:
a first control gate electrode including a first portion, a second portion and a third portion, the first portion extending in a first direction, the second portion being provided adjacent to the first portion and extending in the first direction, the third portion being connected to an end of the first portion and an end of the second portion, and the third portion being extending in a second direction crossing to the first direction;
a plurality of second control gate electrodes stacked right above the first portion of the first control gate electrode; and
a plurality of third control gate electrodes stacked right above the second portion of the first control gate electrode and being apart from the plurality of second control gate electrodes.

13. The semiconductor memory device according to claim 12, further comprising
a first via contact being connected to the third portion of the first control gate electrode.

14. The semiconductor memory device according to claim 13, further comprising
a second via contact being connected to the second control gate electrode, and
a third via contact being connected to the third control gate electrode.

15. The semiconductor memory device according to claim 14, further comprising:
a first wiring line connected to the first via contact; and
a second wiring line commonly connected to the second via contact and the third via contact.

16. The semiconductor memory device according to claim 12, further comprising:
a first insulating layer disposed between the first portion and the second portion of the first control gate electrode and provided along the first direction.

17. The semiconductor device according to claim 12, wherein the second and third electrodes are in a same level and are not part of a comb-shaped electrode.

18. The semiconductor device according to claim 1, wherein the second and third electrodes are in a same level and are not part of a comb-shaped electrode.

* * * * *